(12) United States Patent
Yigit

(10) Patent No.: US 11,387,531 B2
(45) Date of Patent: Jul. 12, 2022

(54) METHOD FOR MINIMIZING CENTER FREQUENCY SHIFT AND LINEARITY ERRORS IN YIG FILTERS

(71) Applicant: ASELSAN ELEKTRONIK SANAYI VE TICARET ANONIM SIRKETI, Ankara (TR)

(72) Inventor: Yarkin Yigit, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 306 days.

(21) Appl. No.: 16/876,205

(22) Filed: May 18, 2020

(65) Prior Publication Data

US 2020/0373645 A1 Nov. 26, 2020

(30) Foreign Application Priority Data

May 20, 2019 (TR) .................................. 2019/07601

(51) Int. Cl.
*H01P 1/218* (2006.01)
*G01R 29/00* (2006.01)

(52) U.S. Cl.
CPC .............. *H01P 1/218* (2013.01); *G01R 29/00* (2013.01)

(58) Field of Classification Search
CPC .......... H01P 1/218; H01P 1/215; H01P 1/217; H01P 1/20; H01P 1/18; H01P 1/181; H01P 1/19; G01R 29/00
See application file for complete search history.

(56) References Cited

U.S. PATENT DOCUMENTS

| 4,480,238 A | * | 10/1984 | Iwasaki | .................... | H01P 1/218 333/202 |
| 5,221,912 A | * | 6/1993 | Keane | ..................... | H01P 1/218 333/202 |
| 7,573,357 B2 | * | 8/2009 | Hohenester | ............. | H01P 1/218 333/202 |

FOREIGN PATENT DOCUMENTS

CN 105186090 A 12/2015

* cited by examiner

*Primary Examiner* — Stephen E. Jones
(74) *Attorney, Agent, or Firm* — Bayramoglu Law Offices LLC

(57) ABSTRACT

A method for minimizing center frequency shift and linearity errors encountered in YIG filters, comprising the following steps: automatically generating data packages in test unit depending on the user request or containing all filter characteristic states and transmitting them to the driver circuit, adjusting the desired voltage level by means of the digital to analog converters contained in the structure of the data packages received by the driver circuit, and transmitting the adjusted voltage level to the YIG filter, measuring filter characteristics (scattering parameters) corresponding to the data packages transmitted to the YIG filter in the analyser, in order to calculate the center frequency shift of the filter, determining the center frequency and linearity calculations, and recording the characteristic features measured by the analyser in the test unit.

1 Claim, 1 Drawing Sheet

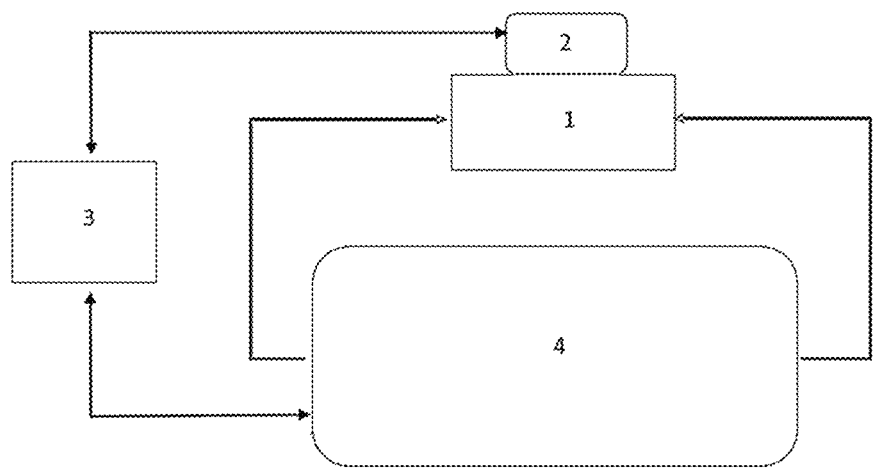

METHOD FOR MINIMIZING CENTER FREQUENCY SHIFT AND LINEARITY ERRORS IN YIG FILTERS

CROSS REFERENCE TO THE RELATED APPLICATIONS

This application is based upon and claims priority to Turkish Patent Application No. 2019/07601, filed on May 25, 2019, the entire contents of which are incorporated herein by reference.

TECHNICAL FIELD

The present invention relates to a method which minimizes the center frequency shift (hysteresis) and linearity errors with the open loop approximation of radio frequency (RF) adjustable yttrium iron garnet (YIG) filters.

More particularly, the present invention relates to a method for minimizing center frequency shift (hysteresis) and linearity errors within the filter's own structure without making any hardware changes to the YIG filters.

BACKGROUND

Yttrium iron garnet acts as a resonator for magnetically adjustable filters and microwave frequencies. YIG filters are used for high quality factors (Q).

A sphere made of yttrium iron garnet crystal acts as a resonator. The spheres in question are produced by rolling and mounted on a ceramic rod and a double small ring is placed in and out of the area around the sphere. The loops are half-spin, placed at right angles to each other to prevent direct electromagnetic coupling between them, and each one is grounded at one end. The advantage of the mentioned filter is that the garnet can be adjusted over a wide frequency range by changing the strength of the magnetic field. YIG filters usually consist of each sphere and a pair of rings.

The ferrite materials used in YIG filters or the products formed by the reinforcement of them with Lithium-ferrite, nickel-zinc components can exhibit resonator behaviour under the magnetic field. Due to the electrical voltage difference applied to the YIG filters, the filters exhibit different resonance properties and change their electrical characteristics.

The current technique uses low-loss and wide-band (2 GHz-18 GHz) YIG filters with high quality factor (Q>10000) in military applications.

In the current technique, many topologies exist that are used to change the center frequency or bandwidth in RF adjustable YIG filters. In addition to ferrite, micro-electronic-mechanical systems (MEMS), piezoelectric stimulators, some incorrect adjustment effects are observed in the fennel filters designed with varactors. The most important ones among those errors are the center frequency shift (hysteresis) and the linearity effect. Furthermore, temperature and aging of materials also cause adjustment errors.

Depending on the effects mentioned, when the center frequency or bandwidth of the YIG filter is changed, it is necessary to make changes in the applied voltage i.e. electrical/magnetic field. Because, due to the effects of hysteresis and linearity distortion, repeatability is impaired and the desired performance value is not obtained at the previously adjusted voltage or electric/magnetic field value.

In the current technique, the "Closed Loop Approach" method is used to minimize errors encountered in YIG filters. In closed loop approaches, non-linear circuit elements such as amplifiers or mixers are required to be used. This causes the harmonics of spurious signals to disturb the system.

The application number CN105186090 was found during the research on the current technique. The application relates to the resonant structure of the electrically adjustable YIG filter. The application mentions arrangement of a YIG filter structure consisting of four rectangular resonators since the fluctuations in the filter band is high and in order to prevent the filter isolation at the resonance peaks in the high frequency band from degrading. However, the application does not mention the method that minimizes hysteresis and linearity errors within the filter itself without making any hardware changes in the system.

As a result, due to the negativity described above and the inadequacy of the existing solutions on the subject, an improvement in the relevant technical area has been made necessary.

SUMMARY

The invention is inspired by existing situations and aims to solve the disadvantages mentioned above.

The main purpose of the invention is to prevent hysteresis and linearity errors with an updated voltage difference applied within the YIG filter's own structure without any hardware change in the YIG filters with high quality factor (Q>10000), low loss and wide band (2 GHz-18 GHz).

In order to achieve the aforementioned purposes, the invention is a method for minimizing center frequency shift and linearity errors encountered in YIG filters, comprising the process steps of automatically generating data packages in test units depending on the user request or containing all filter characteristic states and transmitting them to the driver circuit, adjusting the desired voltage level by means of the digital to analog converters contained in the structure of the data packages received by the driver circuit, and transmitting the adjusted voltage level to the YIG filter, measurement of scattering parameters (S21, S11, S22) of the filter characteristics corresponding to the data packages transmitted to the YIG filter in the analyser, in order to calculate the center frequency shift of the filter, determining the center frequency and linearity calculations, recording the characteristic features measured by the analyser in the test unit, recording in the test unit the recorded updated characteristic filter values in the calibration tables based on the time intervals at which the measurement is carried, determining different control voltage—center frequency regions for YIG filter characteristics based on the data recorded in the test unit and the using the digital packages corresponding to the region of the frequency/characteristic at which the operator desires to use the YIG filter.

The structural and characteristic features and all advantages of the invention will be understood more clearly through the detailed explanation written with the following FIGURE and references to these FIGURE, and therefore assessment should be made by considering these FIGURE and detailed explanation.

BRIEF DESCRIPTION OF THE DRAWING

FIGURE is the block diagram view of the method of the invention for minimizing the center frequency shift (hysteresis) and linearity errors.

DESCRIPTION OF PART REFERENCES

1. YIG filter
2. Driver circuit

3. Test unit
4. Analyser

DETAILED DESCRIPTION

In this detailed description, the preferred embodiments of the invention for minimizing the center frequency shift and linearity errors of the YIG filters (1) are explained only for a better understanding of the subject.

The software interface of YIG filters (1) operating in 2-18 GHz range is carried out through analog and digital signal controls. YIG filter (1) and the driver circuit (2) of the YIG filter (1) are fed by 28 V, +15 V and −15 V and digitally controlled by a 12-bit parallel data directory via the controller board.

Each data directory sent to the driver circuit (2) of the YIG filter (1) by via the control card means a different voltage level for the YIG filter (1). The transmitted data directories are loaded through the rising edge sensitivity of the latch trigger signal of the driver circuit (2). YIG filter (1) operates in a different configuration corresponding to each incoming 12-bit data. Thus, the YIG filter (1) can be set to a total of 4096 (2^12) different frequencies between 2-18 GHz frequencies with 3.9 MHz steps.

12-bit data directories are automatically sent to the driver circuit (2) by creating data packages based on the user's request or as including all filter characteristic states.
If Data Packages are Created According to the User's Request;

12-bit data directories are transmitted to the driver circuit (2) in the test unit (3) by creating data packages according to the user' request. The driver circuit (2) adjusts the desired voltage level by means of the digital to analog converters contained in the structure of the data packages received, and transmitting the adjusted voltage level to the YIG filter (1), this allows the YIG filter (1) to be set to the desired frequency.

The characteristic properties of the YIG filter (1) set to the desired frequency are measured by means of the analyzer (4). The characteristic features measured include; transmission and suppression loss values of the YIG filter (1), 3 dB bandwidth, 3 dB amplitude values, center frequency and amplitudes of the noise signals that may be encountered over the entire band. In the analyzer (4), the center frequency shift calculation is performed by taking the difference between the center frequencies of the YIG filter (1) for the same voltage potential level (same data package) applied at different time periods/dates. The process of finding the center frequency is determined by the analyzer (4) picking the frequency corresponding to the highest point of the amplitude. Characteristic values are measured with a central frequency change of 3.96 MHz between 2-18 GHz. Linearity calculation; is performed by dividing two consecutive voltage levels (two consecutive digital data packages) corresponding to the difference in frequency by the coefficient of 3.96. The measured characteristic features are transmitted from the analyzer (4) to the test unit (3) and recorded.

A shift in the order of mill amperes in the current drawn by the YIG filter (1) and the driver circuit (2) as a result of the susceptibility of the driver circuit (2) of the YIG filter (1) or the ferrite material in its structure results in a minimum 20 MHz shift in the YIG filter (1). Thereby, the current drawn by the YIG filter (1) is controlled by the test unit (3). If Data Packages are Created Automatically to Include All Filter Characteristic States 12-Bit data package generated automatically within the test unit (3) is transmitted to the drive circuit (2). The driver circuit (2) adjusts the desired voltage level by means of the digital to analog converters contained in the structure of the data packages received, and transmitting the adjusted voltage level to the YIG filter (1), At all voltage levels (4096 steps) where the YIG filter (1) is controlled, the characteristic values of the YIG filter (1) are transmitted to the analyzer (4) and measured in the analyzer (4). In the analyzer (4), the center frequency shift calculation is performed by taking the difference between the center frequencies of the YIG filter (1) for the same voltage potential level (same data package) applied at different time periods/dates. The process of finding the center frequency is determined by the analyzer (4) picking the frequency corresponding to the highest point of the amplitude. Characteristic values are measured with a central frequency change of 3.96 MHz between 2-18 GHz. The linearity calculation is performed by dividing the frequency differences corresponding to two consecutive voltage levels (two consecutive digital data packets) by the coefficient of 3.96. The characteristic features of the YIG filter (1) (transmission and suppression loss values, 3 dB bandwidth, 3 dB amplitude values, filter center frequencies, etc.) are recorded in the test unit (3) due to the 3.96 MHz step size.

The measured and recorded updated characteristic filter values are recorded in the calibration tables in the test unit (3) based on the time periods in which the measurement was taken. The mentioned filter characteristics are scattering parameters. (S21, S11, S22). Therefore, effective frequency—voltage pairs are used by the operator to minimise hysteresis and linearity. According to the data recorded in the test unit (3), different control voltage-center frequency regions are determined for YIG filter (1) characteristics. If the operator wants to use the YIG filter (1) at a certain frequency/characteristic, digital packets corresponding to this region are used.

What is claimed is:
1. A method for minimizing a center frequency shift and linearity errors encountered in a YIG filter, comprising the following steps:
  a) automatically generating data packages in a test unit depending on a user request or containing filter characteristic states and transmitting the data packages to a driver circuit;
  b) adjusting a predetermined voltage level to obtain an adjusted voltage level by means of digital to analog converters contained in a structure of the data packages received by the driver circuit, and transmitting the adjusted voltage level to the YIG filter;
  c) measuring filter characteristics corresponding to the data packages transmitted to the YIG filter in an analyser in a plurality of time periods, to calculate the center frequency shift of the YIG filter, and determining the center frequency shift and the linearity errors;
  d) recording the filter characteristics measured by the analyser in the test unit,
  e) recording updated characteristic filter values recorded in calibration tables in the test unit based on the plurality of time periods;
  f) determining a plurality of control voltage-center frequency regions for the filter characteristics based on the data packages recorded in the test unit and then using the data packages corresponding to a frequency-characteristic, wherein an operator uses the YIG filter at the frequency-characteristic.

* * * * *